(12) United States Patent
Yang et al.

(10) Patent No.: US 12,412,527 B1
(45) Date of Patent: Sep. 9, 2025

(54) DISPLAY PIXEL WITH A CURRENT SINK TO MITIGATE ARTIFACTS CAUSED BY AN UNDER-DISPLAY LIGHT EMITTER

(71) Applicant: Apple Inc., Cupertino, CA (US)

(72) Inventors: Shyuan Yang, San Jose, CA (US); Abbas Jamshidi Roudbari, Saratoga, CA (US); Jean-Pierre S Guillou, La Jolla, CA (US); Mario Miscuglio, Sunnyvale, CA (US); Ran Tu, Palo Alto, CA (US); Ricardo A Peterson, Fremont, CA (US); Salman Karbasi, San Jose, CA (US); Snehal T Jariwala, San Jose, CA (US); Ting-Kuo Chang, San Jose, CA (US); Tsung-Ting Tsai, San Jose, CA (US); Warren S Rieutort-Louis, Cupertino, CA (US); Yang Xu, Santa Clara, CA (US); Yi Qiao, San Jose, CA (US); Yuchi Che, Santa Clara, CA (US); Yue Cui, Los Gatos, CA (US); Zhizhen Ma, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 53 days.

(21) Appl. No.: 18/627,925

(22) Filed: Apr. 5, 2024

Related U.S. Application Data

(60) Provisional application No. 63/501,220, filed on May 10, 2023.

(51) Int. Cl.
*H10F 55/00* (2025.01)
*G01J 1/44* (2006.01)
*G06F 3/01* (2006.01)
*G09G 3/3233* (2016.01)
*H10K 59/121* (2023.01)
(Continued)

(52) U.S. Cl.
CPC ....... *G09G 3/3233* (2013.01); *H10K 59/1213* (2023.02); *H10K 59/126* (2023.02); *H10K 59/131* (2023.02)

(58) Field of Classification Search
CPC ............... G09G 3/3233; H10K 59/131; H10K 59/1213; H10K 59/126
See application file for complete search history.

(56) References Cited

U.S. PATENT DOCUMENTS 9,818,765 B2 11/2017 Osawa et al.
10,878,751 B2 12/2020 Lin et al.
(Continued)

*Primary Examiner* — Deeprose Subedi
(74) *Attorney, Agent, or Firm* — Treyz Law Group, P.C.; Joseph F. Guihan

(57) ABSTRACT

A light emitter that operates through a display may cause display artifacts, even when the light emitter operates using non-visible wavelengths. Display artifacts caused by a light emitter that operates through a display may be referred to as emitter artifacts. To mitigate emitter artifacts, a display pixel that overlaps the light emitter may include a transistor that provides a current sink to divert leakage current away from the light-emitting diode in that pixel. A shielding layer may be interposed between the light emitter and a display pixel. The shielding layer may block light from the light emitter. The shielding layer may have an opening that exposes one transistor in the pixel to the light from the light emitter. Pixels that overlap the light emitter may have larger anodes than pixels that do not overlap the light emitter.

20 Claims, 11 Drawing Sheets

(51) Int. Cl.
*H10K 59/126* (2023.01)
*H10K 59/131* (2023.01)

(56) References Cited

U.S. PATENT DOCUMENTS

| | | |
|---|---|---|
| 11,737,327 B2 | 8/2023 | Yi et al. |
| 2015/0379938 A1 | 12/2015 | Choi et al. |
| 2020/0066815 A1 | 2/2020 | Choi et al. |
| 2025/0151449 A1* | 5/2025 | Qin ........................ H10H 29/30 |

* cited by examiner

DISPLAY PIXEL WITH A CURRENT SINK TO MITIGATE ARTIFACTS CAUSED BY AN UNDER-DISPLAY LIGHT EMITTER

This application claims the benefit of U.S. provisional patent application No. 63/501,220 filed May 10, 2023, which is hereby incorporated by reference herein in its entirety.

BACKGROUND

This relates generally to electronic devices, and, more particularly, to electronic devices with displays.

Electronic devices often include displays. For example, an electronic device may have a light-emitting diode (LED) display based on light-emitting diode pixels. In this type of display, each pixel includes a light-emitting diode and circuitry for controlling application of a signal to the light-emitting diode to produce light.

There is a trend towards borderless electronic devices with a full-face display. These devices, however, may still need to include sensors such as cameras, ambient light sensors, and proximity sensors to provide other device capabilities. Since the display now covers the entire front face of the electronic device, the sensors will have to be placed under the display stack.

It is within this context that the embodiments herein arise.

SUMMARY

An electronic device may include a display comprising pixels and a light emitter that emits light through a portion of the display. The portion of the display may include a first pixel of the pixels and the first pixel may include a first power supply terminal, a second power supply terminal, a light-emitting diode having an anode and a cathode, a drive transistor, a first transistor that is connected between the anode and a first signal line that provides a first bias voltage, and a second transistor that is connected between the anode and a second signal line that provides a second bias voltage. The drive transistor and the light-emitting diode may be connected in series between the first and second power supply terminals.

An electronic device may include a display comprising pixels, a light emitter that emits light through a portion of the display, and a shielding layer that blocks the light from the light emitter. The portion of the display may include a first pixel of the pixels and the first pixel may include a first power supply terminal, a second power supply terminal, a light-emitting diode having an anode and a cathode, a drive transistor, and a first transistor that is connected between the anode and a first signal line that provides a first bias voltage. The shielding layer may be interposed between the light emitter and the first pixel, the shielding layer may overlap the drive transistor, and the shielding layer may have an opening that is aligned with the first transistor. The drive transistor and the light-emitting diode may be connected in series between the first and second power supply terminals.

An electronic device may include a display comprising first and second portions and a light emitter that overlaps the first portion of the display. The light emitter may not overlap the second portion of the display, the first portion of the display may include a first pixel that emits light of a first color, the first pixel may comprise a first anode with a first total area and a first emissive area with a second total area, the second portion of the display may comprise a second pixel that emits light of the first color, the second pixel may comprise a second anode with a third total area and a second emissive area with a fourth total area, the second total area may be within 10% of the fourth total area, and the first total area may be at least 20% greater than the third total area.

DETAILED DESCRIPTION

Figure 1:
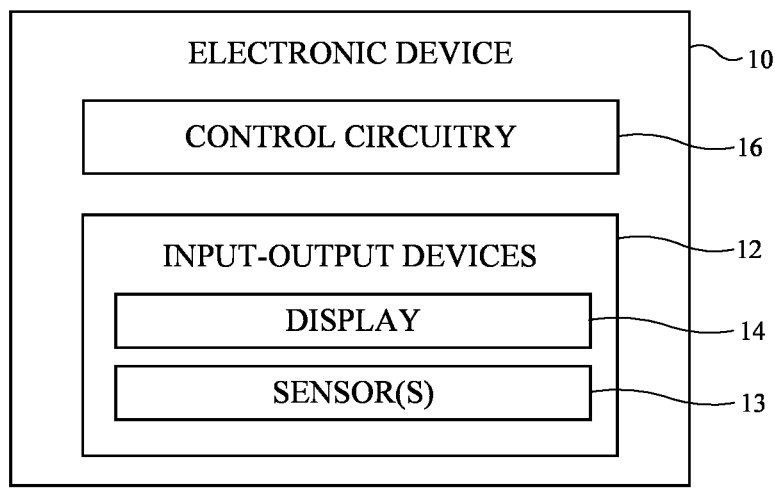
FIG. 1 is a schematic diagram of an illustrative electronic device having a display and one or more sensors in accordance with some embodiments.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Input-output devices 12 may also include one or more sensors 13 such as force sensors (e.g., strain gauges, capacitive force sensors, resistive force sensors, etc.), audio sensors such as microphones, touch and/or proximity sensors such as capacitive sensors (e.g., a two-dimensional capacitive touch sensor associated with a display and/or a touch sensor that forms a button, trackpad, or other input device not associated with a display), and other sensors. In accordance with some embodiments, sensors 13 may include optical sensors such as optical sensors that emit and detect light (e.g., optical proximity sensors such as transreflective optical proximity structures), ultrasonic sensors, and/or other touch and/or proximity sensors, monochromatic and color ambient light sensors, image sensors, fingerprint sensors, temperature sensors, proximity sensors and other sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 13 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

Display 14 may be an organic light-emitting diode display, a display formed from an array of discrete light-emitting diodes (microLEDs) each formed from a crystalline semiconductor die, a liquid crystal display or any other suitable type of display. Device configurations in which display 14 is an organic light-emitting diode display are sometimes described herein as an example. This is, however, merely illustrative. Any suitable type of display may be used, if desired. In general, display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
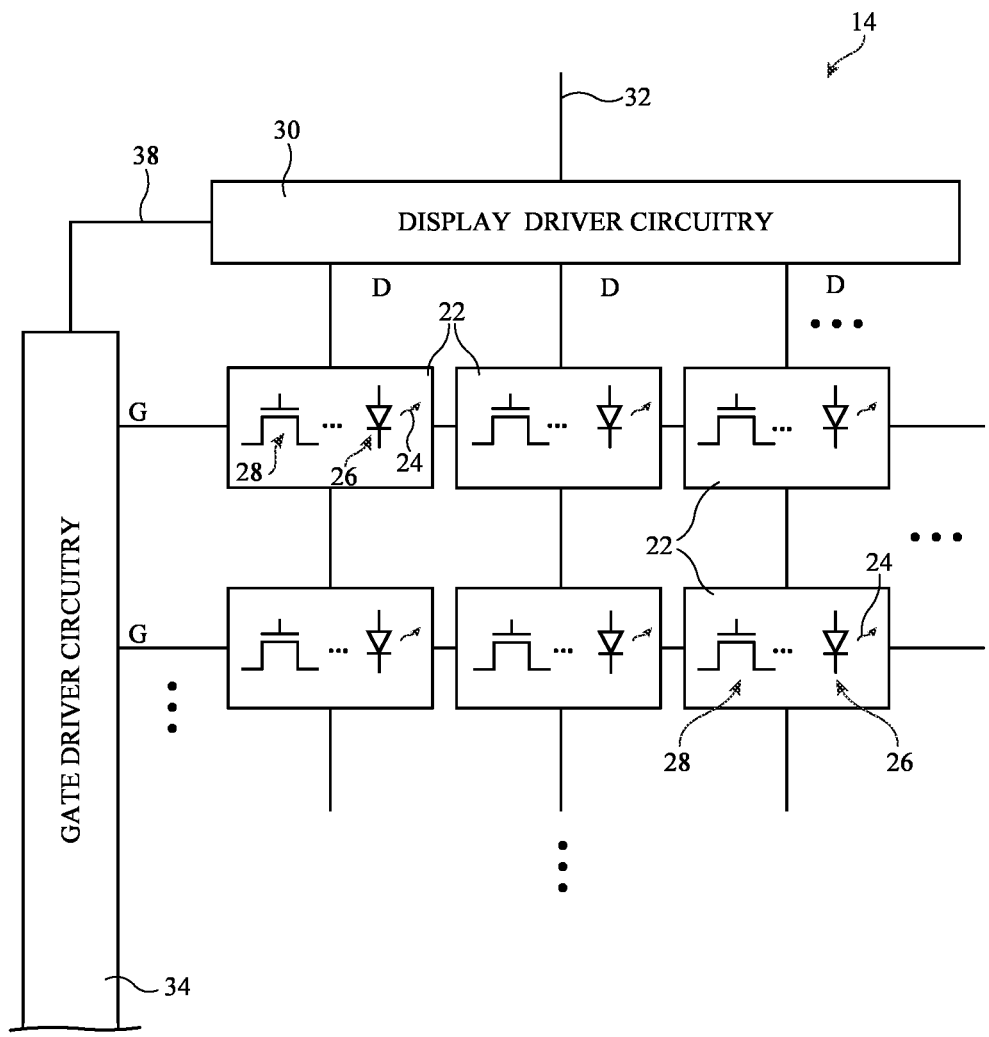
FIG. 2 is a schematic diagram of an illustrative display with light-emitting elements in accordance with some embodiments.

A top view of a portion of display 14 is shown in FIG. 2. As shown in FIG. 2, display 14 may have an array of pixels 22 formed on a substrate. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may include a light-emitting diode 26 that emits light 24 under the control of a pixel control circuit formed from thin-film transistor circuitry such as thin-film transistors 28 and thin-film capacitors. Thin-film transistors 28 may be polysilicon thin-film transistors, semiconducting-oxide thin-film transistors such as indium zinc gallium oxide (IGZO) transistors, or thin-film transistors formed from other semiconductors. Pixels 22 may contain light-emitting diodes of different colors (e.g., red, green, and blue) to provide display 14 with the ability to display color images or may be monochromatic pixels.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply display driver circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14.

Gate driver circuitry 34 (sometimes referred to as row control circuitry) may be implemented as part of an integrated circuit and/or may be implemented using thin-film transistor circuitry. Horizontal control lines G in display 14 may carry gate line signals such as scan line signals, emission enable control signals, and other horizontal control signals for controlling the display pixels 22 of each row. There may be any suitable number of horizontal control signals per row of pixels 22 (e.g., one or more row control signals, two or more row control signals, three or more row control signals, four or more row control signals, etc.).

The region on display 14 where the display pixels 22 are formed may sometimes be referred to herein as the active area. Electronic device 10 has an external housing with a peripheral edge. The region surrounding the active area and within the peripheral edge of device 10 is the border region. Images can only be displayed to a user of the device in the active region. It is generally desirable to minimize the border region of device 10. For example, device 10 may be provided with a full-face display 14 that extends across the entire front face of the device. If desired, display 14 may also wrap around over the edge of the front face so that at least part of the lateral edges or at least part of the back surface of device 10 is used for display purposes.

Figure 3:
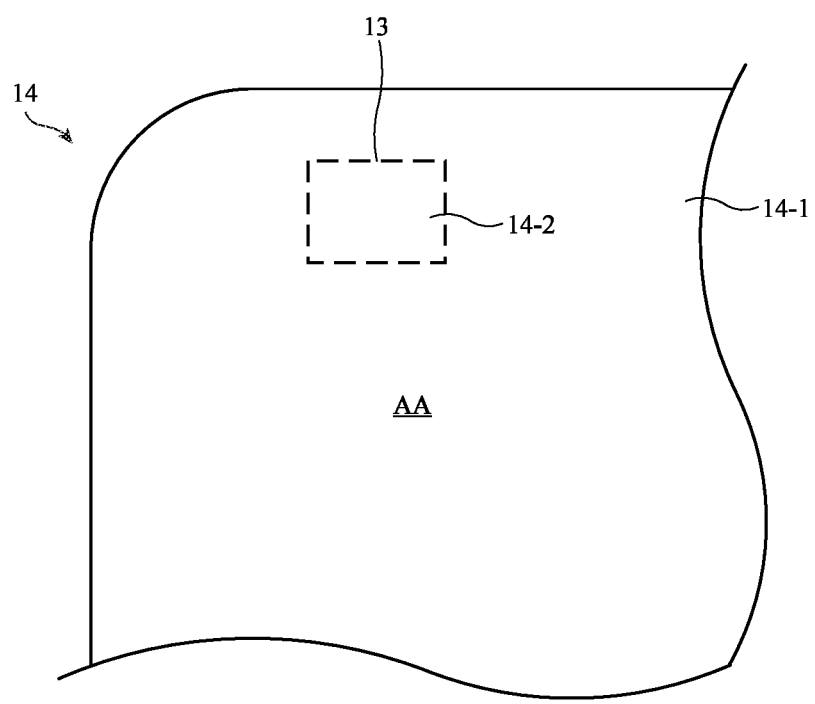
FIG. 3 is a top view of an illustrative display with an underlying sensor in accordance with some embodiments.

Device 10 may include a sensor 13 mounted behind display 14 (e.g., behind the active area of the display). FIG. 3 is a top view of an illustrative display 14 with a sensor 13 mounted behind the active area (AA) of the display. Sensor 13 may sometimes include a light-emitting component in addition to a sensor component. As one illustrative example, sensor 13 may be a proximity sensor that includes a light source in addition to a light sensor. The light source is configured to emit light through the active area of the display from underneath the active area of the display. The light sensor is configured to sense reflections of the emitted light that pass through the active area of the display to the light sensor. The light source may emit light in a series of pulses at a desired frequency. Each pulse has a desired duration. The properties of the pulses (e.g., frequency, duration, wavelength, intensity, etc.) may sometimes be referred to as a firing mode for the emitter.

To mitigate the impact of sensor 13 on the operation of display 14, sensor 13 may include a light emitter that operates using non-visible-wavelength light. For example, sensor 13 may include an infrared (IR) light emitter or an ultraviolet (UV) light emitter and may have a corresponding light sensor (e.g., an IR light sensor for an IR light emitter or a UV light sensor for a UV light emitter). Using a light emitter that operates using non-visible-wavelength light may prevent the light emitted by the light emitter from being directly observed by a viewer of display 14. However, the light emitter may still cause visible artifacts in display 14.

As previously mentioned, display 14 includes thin-film transistor circuitry that may include polysilicon thin-film transistors, semiconducting-oxide thin-film transistors such as indium zinc gallium oxide (IGZO) transistors, and/or thin-film transistors formed from other semiconductors. Additionally, display 14 may include one or more organic layers that form organic light-emitting diode pixels in an organic light-emitting diode display. One or more materials in the thin-film transistor circuitry and the organic layers that form pixels 22 may be photosensitive to non-visible-wavelength light. Accordingly, even if sensor 13 includes a light emitter that uses non-visible-wavelength light, emissions of the non-visible-wavelength light may cause display artifacts in the localized region of the display that overlaps the light emitter.

Display artifacts caused by emission of the light emitter in sensor 13 may include causing a region of the display over the light emitter to have a different brightness or color than the surrounding portions of the display. The artifacts may be static or may be transient (e.g., may rapidly appear and disappear so as to have the appearance of blinking). The artifacts may be more visible in a dark ambient light environment than in a bright ambient light environment. The type and severity of the display artifacts caused by emission of the light emitter in sensor 13 may depend on emitter wavelength, emitter beam size, emitter irradiation level, emitter pulse duration, emitter firing rate, display panel architecture, display OLED design, display TFT design, the brightness of content on the display over the emitter, the color of content on the display over the emitter, display refresh rate, temperature, etc.

To mitigate artifacts caused by emission of the light emitter in sensor 13, pixels in display portion 14-2 (that overlap the light emitter) may be different than the pixels in display portion 14-1 (that do not overlap the light emitter).

Figure 4:
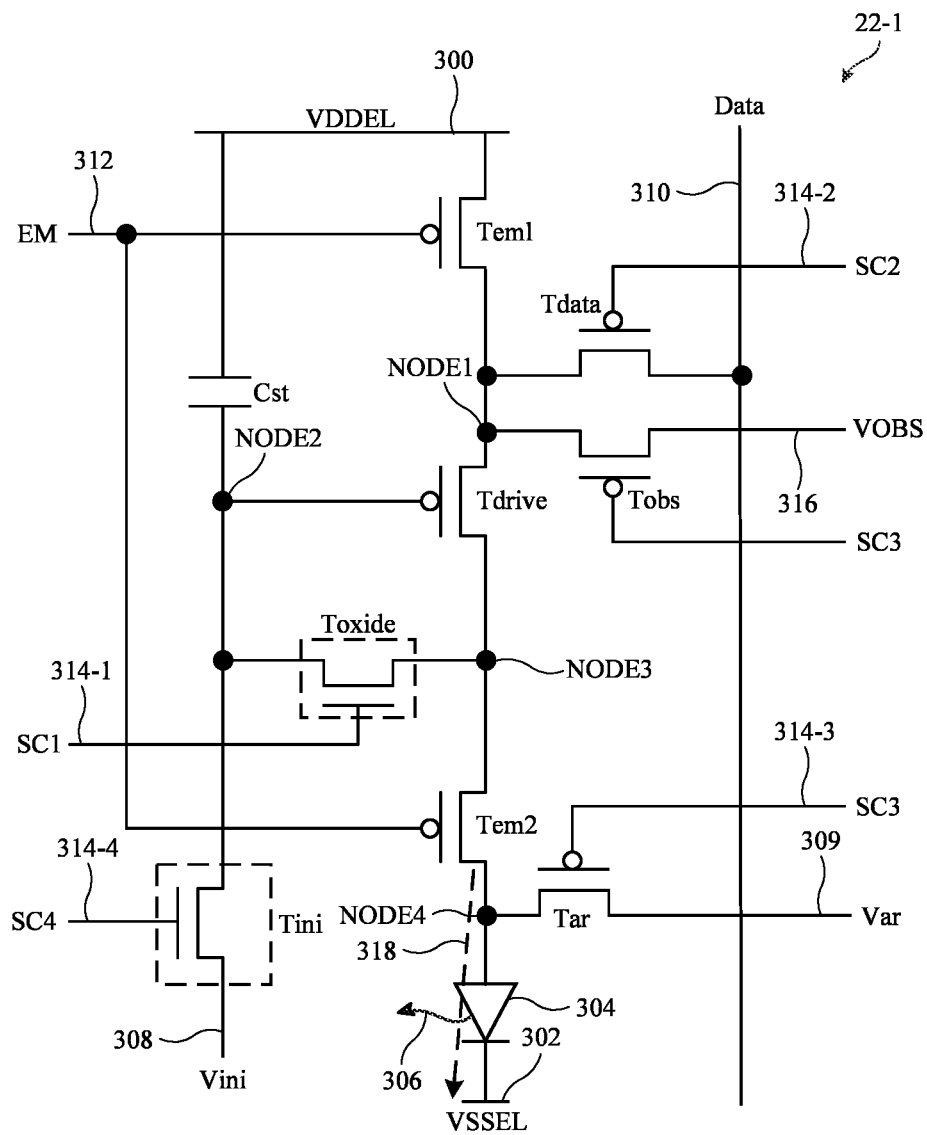
FIG. 4 is a circuit diagram of an illustrative pixel in accordance with some embodiments.

FIG. 4 is a circuit diagram of an illustrative organic light-emitting diode display pixel 22-1 in display portion 14-1. The display pixel may be operable to support both in-pixel threshold voltage compensation and external threshold voltage compensation. As shown in FIG. 4, display pixel 22-1 may include a storage capacitor Cst, n-type (i.e., n-channel) transistors such as semiconducting-oxide transistors Toxide and Tini and p-type (i.e., p-channel) transistors such as a drive transistor Tdrive, a data loading transistor Tdata, an on-bias stress transistor Tobs, a first emission transistor Tem1, an anode reset transistor Tar, and second emission transistor Tem2.

Transistors Toxide and Tini may be formed using semiconducting oxide (e.g., a transistor with a channel formed from semiconducting oxide such as indium gallium zinc oxide or IGZO). The remaining transistors may be thin-film transistors formed from a semiconductor such as silicon (e.g., polysilicon channel deposited using a low temperature process, sometimes referred to as LTPS or low-temperature polysilicon). Semiconducting-oxide transistors exhibit relatively lower leakage than silicon transistors, so implementing transistors Toxide and Tini as semiconducting-oxide transistors will help reduce flicker (e.g., by preventing current from leaking away from the gate terminal of drive transistor Tdrive).

Tdrive may optionally be implemented as a semiconducting-oxide transistor. Transistor Tdrive serves as the drive transistor and has a threshold voltage (Vth) that is critical to the emission current of pixel 22. Since the threshold voltage of transistor Tdrive may experience hysteresis, forming the drive transistor as a top-gate semiconducting-oxide transistor may help reduce the hysteresis (e.g., a top-gate IGZO transistor experiences less Vth hysteresis than a silicon transistor). If general, any of the transistors may optionally be implemented as semiconducting-oxide transistors. Moreover, any one or more of the p-channel transistors may be n-type (i.e., n-channel) thin-film transistors.

Display pixel 22-1 may include an organic light-emitting diode (OLED) 304. A positive power supply voltage VDDEL may be supplied to positive power supply terminal 300, and a ground power supply voltage VSSEL may be supplied to ground power supply terminal 302. Positive power supply voltage VDDEL may be 3 V, 4 V, 5 V, 6 V, 7 V, 2 to 8 V, or any suitable positive power supply voltage level. Ground power supply voltage VSSEL may be 0 V, −1 V, −2 V, −3 V, −4 V, −5 V, −6V, −7 V, or any suitable ground or negative power supply voltage level. The state of drive transistor Tdrive controls the amount of current flowing from terminal 300 to terminal 302 through diode 304, and therefore the amount of emitted light 306 from display pixel 22-1. Organic light-emitting diode 304 may have an associated parasitic capacitance $C_{OLED}$.

Terminal 308 may be used to supply an initialization voltage Vini (e.g., a negative voltage such as −1 V, −2 V, −3 V, −4V, −5 V, −6 V, or other suitable voltage) to assist in turning off diode 304 when diode 304 is not in use. Terminal 308 is therefore sometimes referred to as the initialization line. Control signals from display driver circuitry such as gate driver circuitry 34 of FIG. 2 are supplied to control terminals such as row control terminals 312, 314-1, 314-2, 314-3, and 314-4. Row control terminal 312 may serve as an emission control terminal (sometimes referred to as an emission line or emission control line), whereas row control terminals 314-1, 314-2, 314-3, and 314-4 may serve as first, second, third, and fourth scan control terminals (sometimes referred to as scan lines or scan control lines). Emission control signal EM may be supplied to terminal 312. Scan control signals SC1, SC2, SC3, and SC4 may be applied to scan terminals 314-1, 314-2, 314-3, and 314-4, respectively. A data input terminal such as data signal terminal 310 is coupled to a respective data line 26 of FIG. 1 for receiving image data for display pixel 22. Data terminal 310 may also be referred to as the data line.

Control signals Tem1, Tem2, SC2, and SC3 for modulating the p-type silicon transistors may be driven low to turn on those transistors (since p-type transistors are "active-low" devices) and driven high to turn them off. Control signals Tem1, Tem2, SC2, and SC3, when asserted, may generally be driven to a voltage level that is lower than VSSEL (e.g., to overdrive the corresponding transistors). As an example, if VSSEL is equal to −3.5 V, signals Tem1, Tem2, SC2, and SC3 might be driven to −9 V when asserted. Control signals Tem1, Tem2, SC2, and SC3, when deasserted, may generally be driven to a voltage level that is higher than VDDEL (e.g., to further deactivate the corresponding transistors to help minimize leakage). As an example, if VDDEL is equal to 4.5 V, signals Tem1, Tem2, SC2, and SC3 might be driven to 7 V when deasserted.

Control signals SC1 and SC4 for modulating the n-type semiconducting-oxide transistors may be driven high to turn on those transistors (since n-type transistors are "active-high" devices) and driven low to turn them off. Control signals SC1 and SC4, when asserted, may generally be driven to a voltage level that is higher than VDDEL to overdrive the transistor. As an example, if VDDEL is equal to 5 V, signals SC1 and SC4 might be driven to 12 V when asserted. Control signals SC1 and SC4, when deasserted, may generally be driven to a voltage level that is lower than VSSEL to minimize leakage through transistors Toxide and Tini. As an example, if VSSEL is equal to −2 V, signal SC1 might be driven to −6 V when deasserted. The disclosed high and low voltage levels for each of these row control signals are merely illustrative and can be adjusted to other suitable voltage levels to support the desired mode of operation.

In the example of FIG. 4, transistors Tem1, Tdrive, Tem2, and OLED 304 are coupled in series between power supply terminals 300 and 302. In particular, first emission control transistor Tem1 may have a source terminal that is coupled to positive power supply terminal 300, a gate terminal that receives emission control signal EM via emission line 312, and a drain terminal (labeled as Node1). The terms "source" and "drain" terminals of a transistor can sometimes be used interchangeably and may therefore sometimes be referred to as "source-drain" terminals.

Drive transistor Tdrive may have a source terminal coupled to Node1, a gate terminal (labeled as Node2), and a drain terminal (labeled as Node3). Second emission control transistor Tem2 may have a source terminal coupled to Node3, a gate terminal that also receives emission control signal EM via emission line 312, and a drain terminal (labeled as Node4) coupled to ground power supply terminal 302 via light-emitting diode 304. Configured in this way, emission control signal EM can be asserted (e.g., driven low or temporarily pulsed low) to turn on transistors Tem1 and Tem2 during an emission phase to allow current to flow through light-emitting diode 304.

Storage capacitor Cst may have a first terminal that is coupled to positive power supply line 300 and a second terminal that is coupled to Node2. Image data that is loaded into pixel 22 may be at least partially stored on pixel 22 by using capacitor Cst to hold charge throughout the emission phase. Transistor Toxide may have a source terminal coupled to Node2, a gate terminal configured to receive scan control signal SC1 via scan line 314-1, and a drain terminal coupled to Node3. Signal SC1 may be asserted (e.g., driven high or temporarily pulsed high) to turn on n-type transistor Toxide to short the drain and gate terminals of transistor Tdrive. A transistor configuration where the gate and drain terminals are shorted is sometimes referred to as being "diode-connected."

Data loading transistor Tdata may have a source terminal coupled to data line 310, a gate terminal configured to receive scan control signal SC2 via scan line 314-2, and a drain terminal coupled to Node1. Configured in this way, signal SC2 can be asserted (e.g., driven low or temporarily pulsed low) to turn on transistor Tdata, which will allow a data voltage from data line 310 to be loaded onto Node1.

As shown in FIG. 4, pixel 22-1 includes a transistor Tini that may be implemented as an n-channel semiconducting-oxide transistor with a first source-drain terminal connected to the gate terminal of the drive transistor, a gate terminal configured to receive a fourth scan control signal SC4, and a second source-drain terminal connected to an initialization line 308 on which initialization voltage Vini is provided. Display pixel 22 may further include an anode reset transistor Tar that has a source terminal coupled to Node4 (i.e., the anode terminal of OLED 304), a gate terminal configured to receive scan control signal SC3, and a drain terminal coupled to an anode reset line 309. Dynamic initialization line 308 and anode reset line 309 may be separate control lines such that the initialization voltage Vini on line 308 and the anode reset voltage Var on line 309 can be biased to different levels during operation of pixel 22.

An additional dedicated on-bias stress transistor Tobs may be connected to the source terminal of the drive transistor. Transistor Tobs may be implemented as a p-channel silicon transistor with a first source-drain terminal connected to the source terminal of the drive transistor, a gate terminal configured to receive the third scan control signal SC3 (shared with transistor Tar), and a second source-drain terminal connected to an on-bias stress line 316 on which on-bias stress voltage Vobs is provided. The on-bias stress voltage Vobs may be set to some predetermined or suitable voltage level that can be applied to the drive transistor during on-bias stress operations.

If display pixel 22-1 in FIG. 4 were exposed to infrared light (e.g., from a light emitter in sensor 13), a leakage current 318 may be induced that passes through light-emitting diode 304. In other words, leakage current 318 induced by exposure to infrared may cause light-emitting diode 304 to emit light (even if light-emitting diode 304 is in a nominally off/dark state).

To mitigate these types of artifacts caused by exposure to infrared light, pixels 22-2 in display portion 14-2 that overlap at least the light-emitting component in sensor 13 may include a current sink path to reduce leakage current through light-emitting diode 304.

Figure 5:
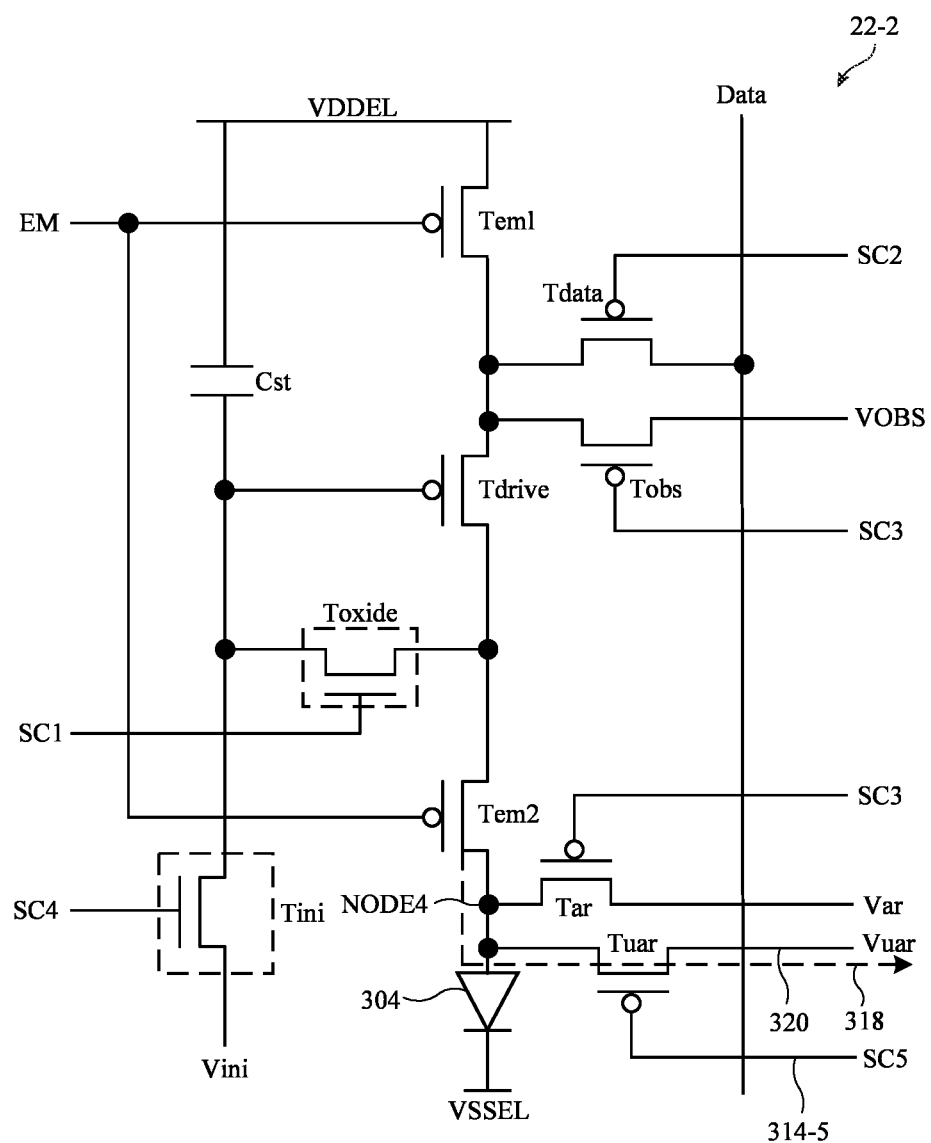
FIG. 5 is a circuit diagram of an illustrative pixel with nine transistors that overlaps a light emitter in accordance with some embodiments.

FIG. 5 is a circuit diagram of an illustrative organic light-emitting diode display pixel 22-2 in display portion 14-2. Pixel 22-2 in FIG. 5 has all of the same components as pixel 22-1 in FIG. 4 and the description of the common components will not be duplicated herein. In addition to the components of pixel 22-1, pixel 22-2 includes an additional transistor Tuar. Transistor Tuar may be a p-type silicon transistor or any other desired type of transistor. Transistor Tuar has a source terminal coupled to Node4 (i.e., the anode terminal of OLED 304), a gate terminal configured to receive scan control signal SC5 from a respective row control terminal 314-5, and a drain terminal coupled to a universal reset line 320. The universal reset line 320 provides a universal anode reset voltage Vuar on line 320 and may optionally be biased to different magnitudes at different times.

When transistor Tuar is asserted, leakage current 318 may be diverted through the transistor Tuar and therefore does not pass through light-emitting diode 304. Asserting transistor Tuar therefore prevents undesired current through light-emitting diode 304 caused by exposure to infrared light.

Figure 6:
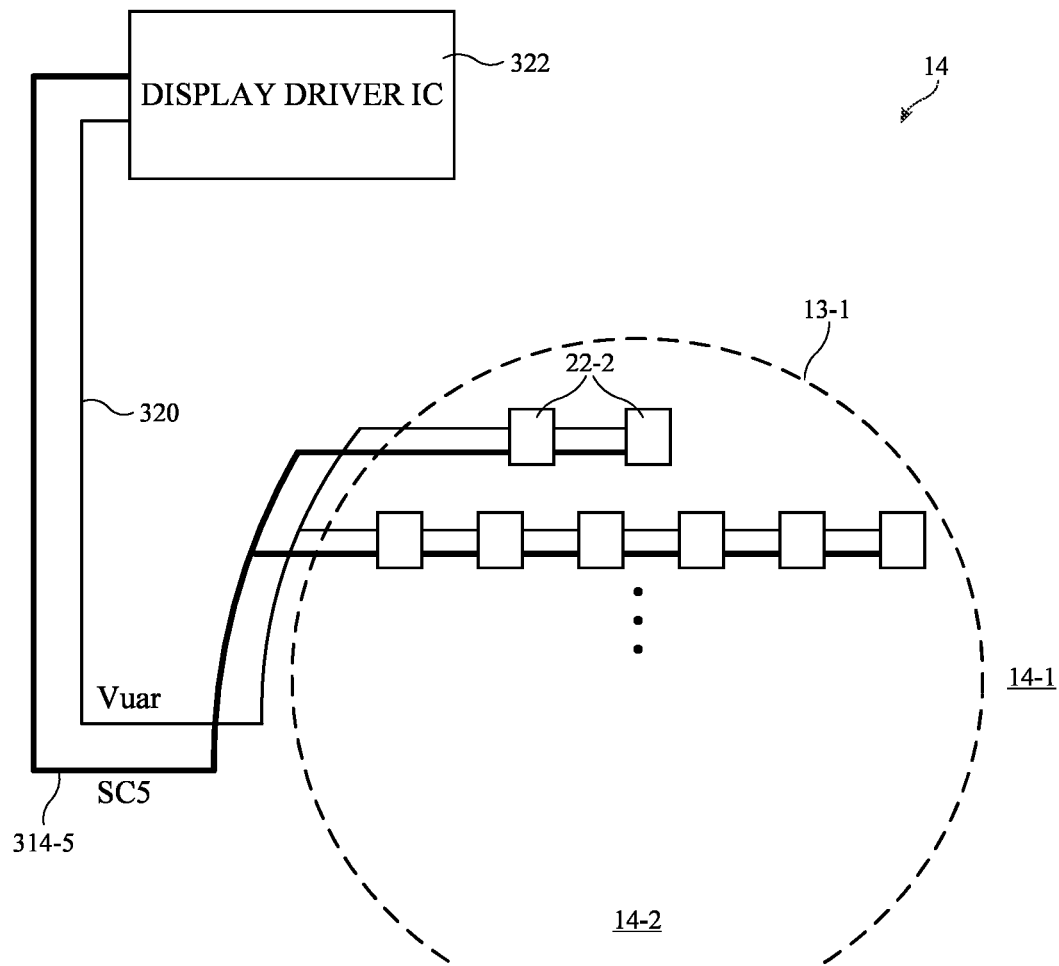
FIG. 6 is a top view of an illustrative display with pixels that overlap a light emitter and that each have a transistor that is universally controlled in accordance with some embodiments.

In FIG. 5, the transistor Tuar in every pixel 22-2 may be controlled universally. In other words, the same universal anode reset voltage Vuar is provided to all of the pixels 22-2 in display portion 14-2 (even when the pixels 22-2 are in different rows and/or columns). Similarly, the same scan control signal SC5 is provided to all of the pixels 22-2 in display portion 14-2 (even when the pixels 22-2 are in different rows and/or columns). FIG. 6 is a top view of a display of this type.

As shown in FIG. 6, display pixels 22-2 are arranged in display portion 14-2. The boundary of display portion 14-2 is defined by a circular footprint (indicated by the dashed line in FIG. 6). Within the circular footprint (e.g., in display portion 14-2), the display pixels have the circuit of FIG. 5 (with an additional transistor Tuar that serves as a current sink). Outside of the circular footprint (e.g., in display portion 14-1), the display pixels have the circuit of FIG. 4 (without the additional transistor Tuar from FIG. 5). The circular footprint of FIG. 6 may also be the circular footprint for an infrared light emitter 13-1 that is part of sensor 13.

Vuar may be provided on signal line 320 and control signal SC5 may be provided on signal line 314-5. As shown in FIG. 6, Vuar and SC5 may be provided universally to all of the pixels 22-2 in portion 14-2. Transistor Tuar may be asserted for all of the pixels 22-2 when, for example, infrared light emitter 13-1 is emitting light. Asserting Tuar when infrared light emitter 13-1 emits light ensures that any leakage currents caused by exposure to infrared light passes through transistors Tuar to signal line 320 (and not through the LEDs 304 of the pixels 22-2).

In FIG. 6, voltage Vuar and control signal SC5 are provided by display driver integrated circuit 322. The display driver integrated circuit may be, for example, a silicon chip that forms at least some of display driver circuitry 30 (as shown in FIG. 2).

The example of Vuar and SC5 being provided universally by display driver integrated circuit 322 is merely illustrative. In alternate arrangement, row-by-row control of transistor Tuar may be implemented using additional gate driver circuitry. In other words, one or more shift registers may be used to provide control signal SC5 and/or voltage Vuar. The one or more shift registers used to provide control signal SC5 and/or voltage Vuar may be referred to as gate-in-panel (GIP) circuits. Each shift register may be formed from a chain of register circuits. Each register circuit may supply a signal (e.g., SC5 or Vuar) to a corresponding row of pixels. During operation, control circuitry 16 (e.g., display driver circuitry 30) may initiate propagation of a control pulse through the shift register. As the control pulse propagates through the shift register, each gate line may be activated in sequence. Each register circuit may be referred to as a stage of the shift register.

It is additionally noted that, if desired, the voltage Vuar may be tuned for each color of pixel. In this type of arrangement, a first voltage (e.g., Vuar_r) may be provided (e.g., universally or row-by-row) to all of the pixels 22-2 of a first color (e.g., red), a second voltage (e.g., Vuar_g) may be provided (e.g., universally or row-by-row) to all of the pixels 22-2 of a second color (e.g., green), and a third voltage (e.g., Vuar_b) may be provided (e.g., universally or row-by-row) to all of the pixels 22-2 of a third color (e.g., blue). The first, second, and third voltages may have different magnitudes to optimize performance for each pixel color.

Figure 7:
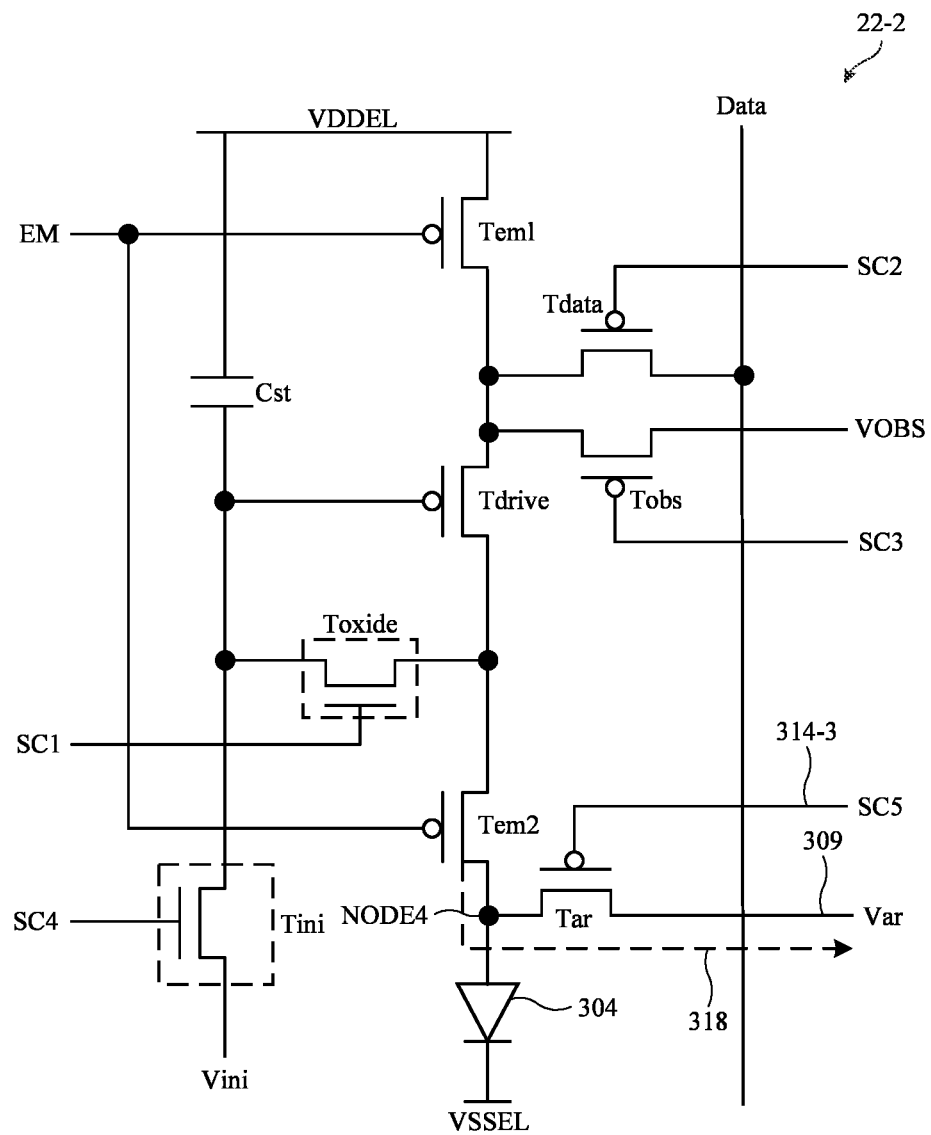
FIG. 7 is a circuit diagram of an illustrative pixel with eight transistors that overlaps a light emitter in accordance with some embodiments.

In another possible embodiment, shown in FIG. 7, each pixel 22-2 may have the same structure as pixels 22-1 in FIG. 4 (e.g., the same number and arrangement of transistors). However, in FIG. 4 the transistor Tar is coupled to the same scan control signal as transistor Tobs (SC3). In contrast, in FIG. 7 the transistor Tar is coupled to an independently controlled scan control signal SC5.

Transistor Tar in FIG. 7 may be a p-type silicon transistor or any other desired type of transistor. Transistor Tar in FIG. 7 has a source terminal coupled to Node4 (i.e., the anode terminal of OLED 304), a gate terminal configured to receive scan control signal SC5 from a respective row control terminal 314-3, and a drain terminal coupled to a signal line 309. The signal line 309 provides an anode reset voltage Var on line 309 and may be biased to different magnitudes at different times.

During operations of pixel 22-2 when the infrared light emitter is not emitting light, the control signal SC5 may be the same as the control signal SC3. In other words, transistors Tobs and Tar are controlled in unison (as in FIG. 4 when Tobs and Tar share the common control signal SC3) when infrared light is not emitted.

However, during operations of pixel 22-2 when the infrared light emitter is emitting light, the control signal SC5 differs from control signal SC3 to ensure that transistor Tar is asserted throughout the time period during which the infrared light emitter is emitting light. When transistor Tar is asserted, leakage current 318 may be diverted through the transistor Tar and therefore does not pass through light-emitting diode 304. Asserting transistor Tar therefore prevents undesired current through light-emitting diode 304 caused by exposure to infrared light.

To maintain the anode reset and on-bias stress functionality of transistors Tar and Tobs (e.g., when the infrared light emitter is not emitting light) while having independent control of Tar and Tobs, a GIP circuit may be included in display 14 to provide control signal SC5.

Figure 8:
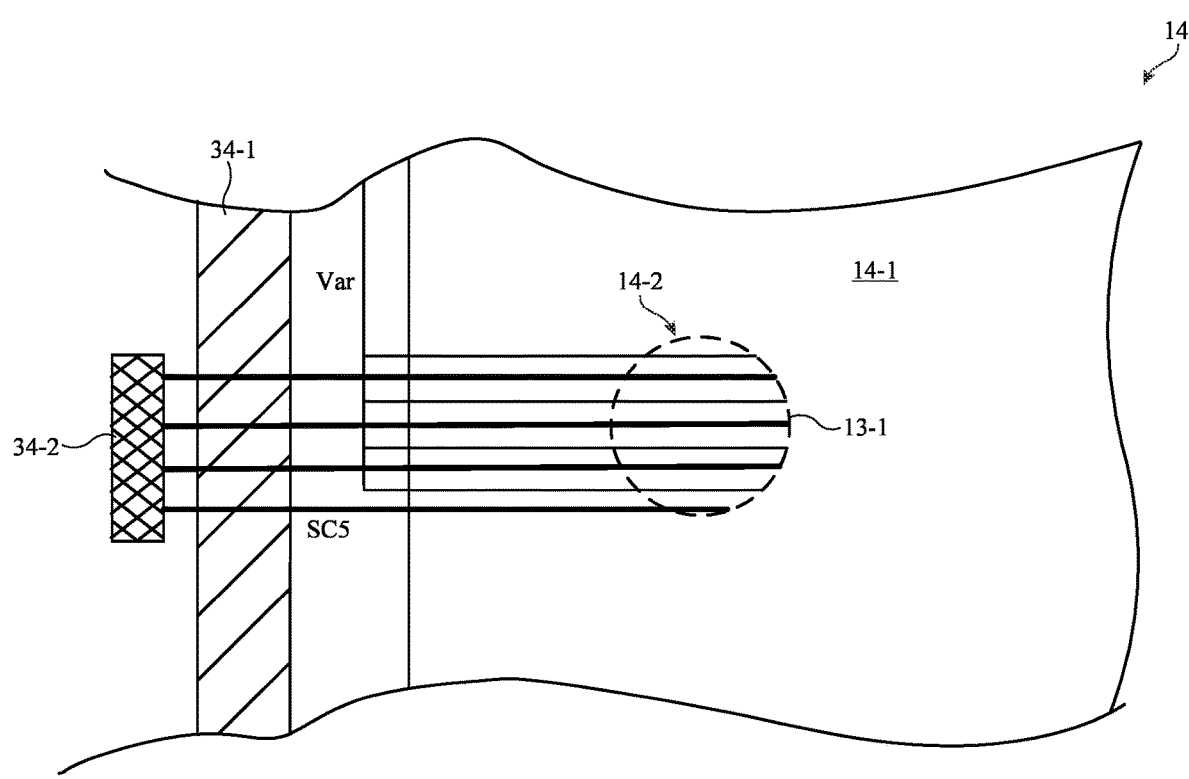
FIG. 8 is a top view of an illustrative display with pixels that overlap a light emitter and that each have a transistor that is controlled row-by-row in accordance with some embodiments.

FIG. 8 is a top view of an illustrative display with pixels in display portion 14-2 having the circuit of FIG. 7 and pixels in display portion 14-1 having the circuit of FIG. 4. As shown in FIG. 8, one or more GIP circuits 34-1 may be included in display 14. The GIP circuits 34-1 may provide control signals such as signals SC1, SC2, SC3, and SC4 to both pixels 22-1 (in portion 14-1) and pixels 22-2 (in portion 14-2). The display of FIG. 8 includes an additional GIP circuit 34-2 that provides control signal SC5 to pixels 22-2 (but not pixels 22-1). GIP circuit 34-2 may include a shift register formed from a chain of register circuits. As the control pulse propagates through the shift register, each gate line (carrying a respective control signal SC5) may be activated in sequence.

Figure 9A:
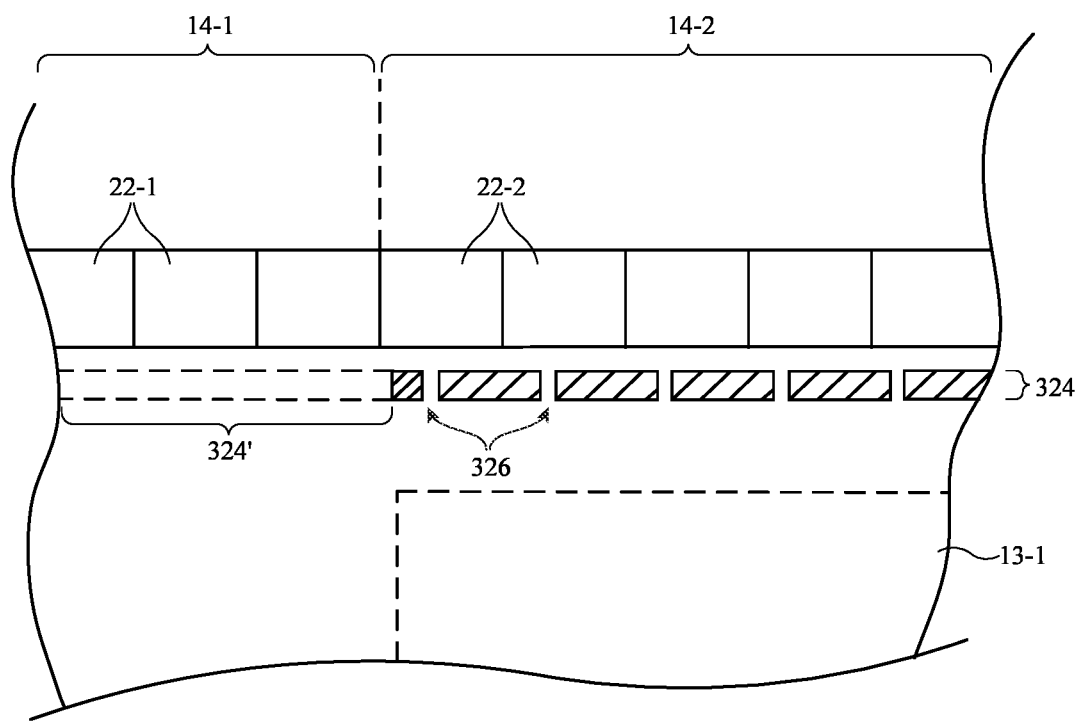
FIG. 9A is a cross-sectional side view of an illustrative display with a shielding layer that has openings aligned with a given transistor in pixels that are overlapped by a light emitter in accordance with some embodiments.

Another technique for mitigating visible artifacts caused by exposure to infrared light is to block some but not all of the transistors in pixels 22-2 from the infrared light. FIG. 9A is a cross-sectional side view of an illustrative display having this type of arrangement. As shown in FIG. 9A, display 14 may include a first portion 14-1 with pixels 22-1 and a second portion 14-2 with pixels 22-2. Pixels 22-2 overlap infrared light emitter 13-1 (e.g., in the vertical direction in which both pixels 22-2 and light emitter 13-1 emit light).

In FIG. 9A, each one of pixels 22-1 and 22-2 may have the same circuit (e.g., the circuit of FIG. 4). However, a shielding layer may have a different footprint in display portion 14-2 than in display portion 14-1. FIG. 9A shows a shielding layer 324 that is interposed between infrared light emitter 13-1 and at least some of the display pixels 22. In general, the shielding layer 324 may block the transistors in pixels 22-2 from being directly exposed to infrared light from light emitter 13-1. The transparency of shielding layer 324 to infrared light may be less than 20%, less than 10%, less than 5%, less than 1%, etc.

Shielding layer 324 may include a plurality of openings 326 in display portion 14-2. Each opening 326 may be aligned with a respective transistor Tar in a respective pixel 22-2 having the structure of FIG. 4. Exposing transistor Tar to infrared light may effectively turn on transistor Tar. In this way, transistor Tar serves as an infrared light activated sink switch. When transistor Tar is not exposed to infrared light from emitter 13-1, transistor Tar may be controlled by control signal SC3 as shown in FIG. 4. When transistor Tar is exposed to infrared light from emitter 13-1, transistor Tar may be asserted and provide a sink for leakage current caused by the infrared light exposure.

Figure 9B:
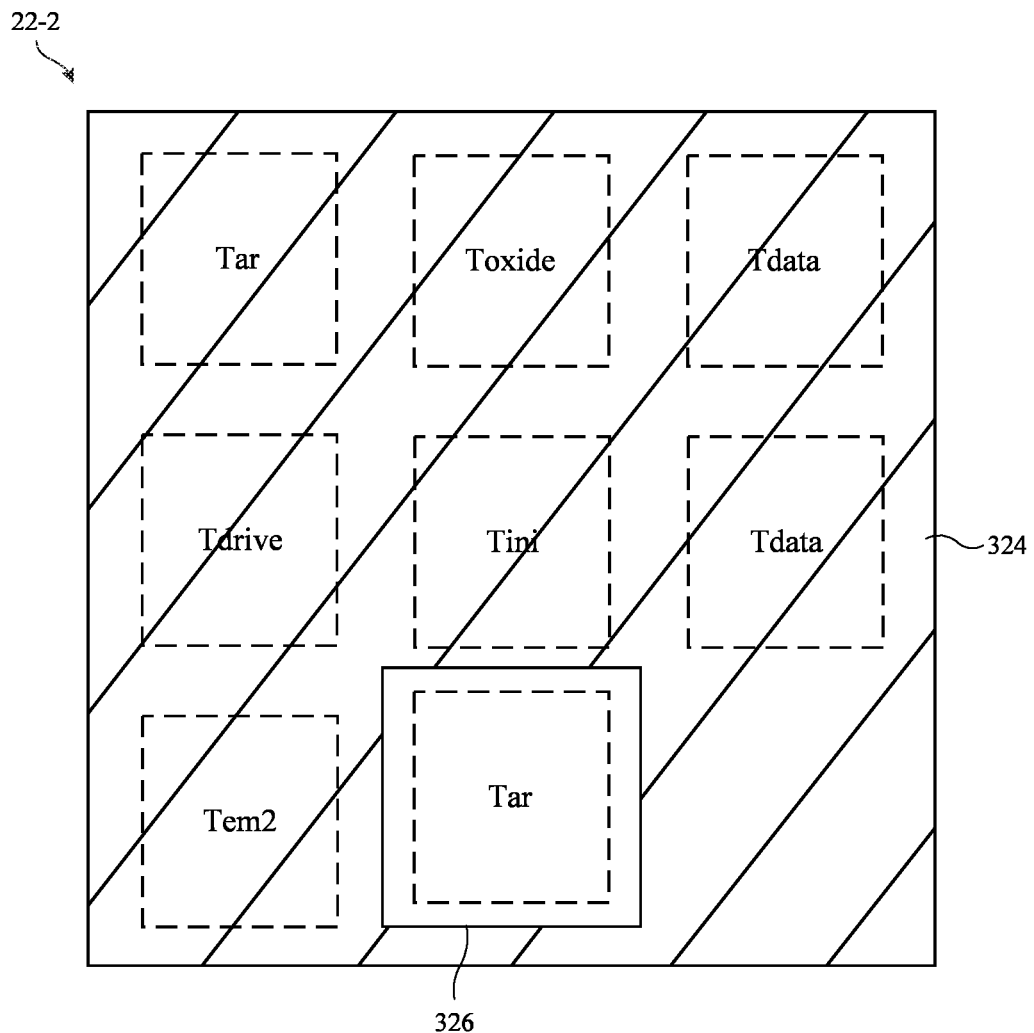
FIG. 9B is a top view of an illustrative pixel that is overlapped by a shielding layer with an opening aligned with a given transistor in accordance with some embodiments.

FIG. 9B is a top view of an illustrative pixel 22-2 that overlaps a shielding layer of the type shown in FIG. 9A. As shown, the shielding layer 324 overlaps (e.g., directly vertically overlaps) transistors Tem1, Toxide, Tdata, Tdrive, Tini, Tdata, and Tem2. However, the shielding layer has an opening 326 that is aligned with transistor Tar such that transistor Tar is directly exposed to infrared light when emitter 13-1 is turned on. In words, light is emitted by emitter 13-1, passes through opening 326, and is incident upon transistor Tar (in that order).

The shielding layer 324 may have openings for transistor Tar for each pixel 22-2 across display portion 14-2. In display portion 14-1, in contrast, the shielding layer 324 may be entirely omitted. Alternatively, shielding layer 324 may be included in display portion 14-1 without any openings for transistor Tar in pixels 22-1. FIG. 9A shows an optional portion 324' of shielding layer 324 that may be included in display portion 14-1 without openings for transistors Tar. In other words, the shielding layer 324 in display portion 14-1 may overlap (e.g., directly vertically overlap) transistors Tar, Tem1, Toxide, Tdata, Tdrive, Tini, Tdata, and Tem2 of pixels 22-1.

Shielding layer 324 may be formed from a conductive material such as metal or any other desired material that is opaque to the light emitted by emitter 13-1.

Instead or in addition to one or more of the techniques above, the pixels 22-2 in display portion 14-2 may have larger anodes than the pixels 22-1 in display portion 14-1. In general, organic light-emitting diode pixels such as pixels 22-1 and 22-2 have a corresponding capacitance ($C_{OLED}$). When a pixel has a larger capacitance, the pixel may be more robust to visible artifacts caused by infrared light exposure (e.g., a greater amount of leakage current may be needed to cause undesired emissions in the pixel). Increasing the size of a pixel's anode may increase the capacitance of that pixel.

Figure 10A:
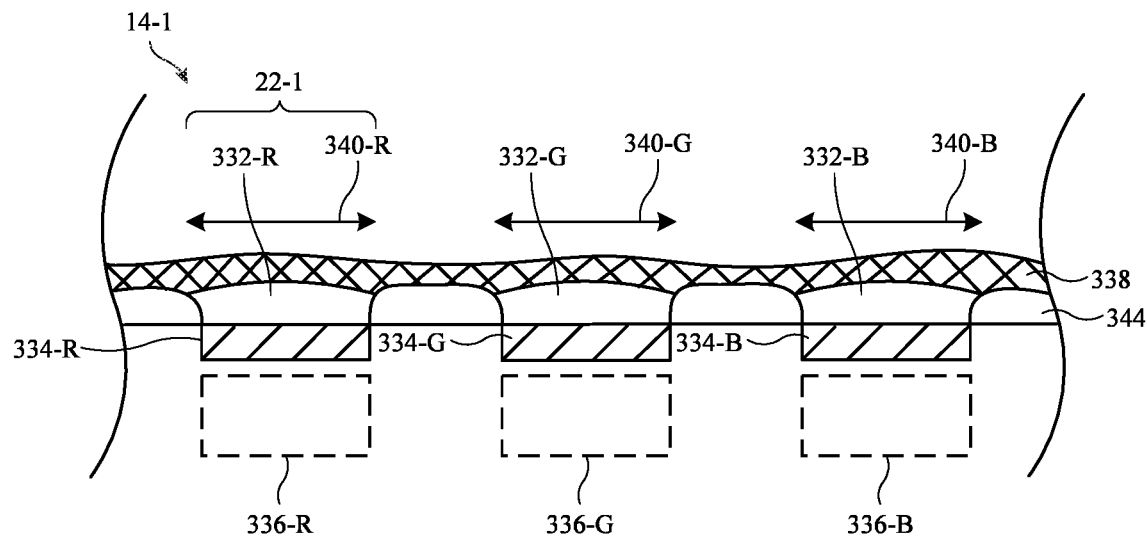
FIG. 10A is a cross-sectional side view of a first display portion of an illustrative display with anodes that are approximately the same size as corresponding emissive areas in accordance with some embodiments.
Figure 10B:
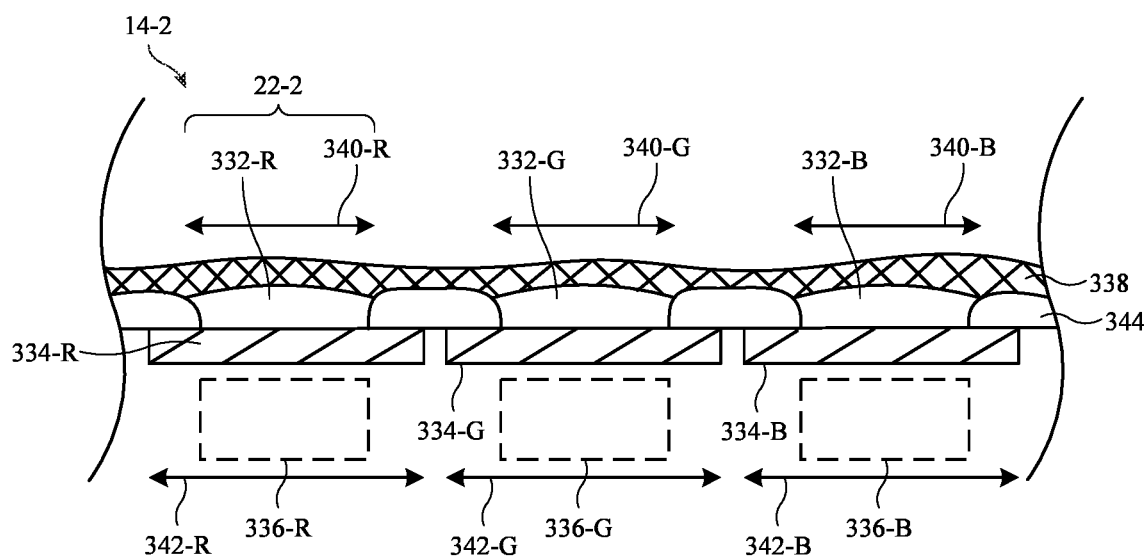
FIG. 10B is a cross-sectional side view of a second display portion of the illustrative display of FIG. 10A with anodes that are larger than corresponding emissive areas in accordance with some embodiments.

FIGS. 10A and 10B show different portions of a single display 14. FIG. 10A is a cross-sectional side view of display portion 14-1 (that is not overlapping with a light emitter as in FIG. 3) whereas FIG. 10B is a cross-sectional side view of display portion 14-2 (that overlaps a light emitter as in FIG. 3). As shown in both FIGS. 10A and 10B, pixels 22-1 and 22-2 may include organic light-emitting diode layers 332 (sometimes referred to as emissive layers) between an anode 334 and a common cathode 338. Thin-film transistor circuitry 336 for each pixel is used to control the voltage applied to anode 334 (and, correspondingly, the brightness of that pixel).

The display may include pixels of different colors. Each one of FIGS. 10A and 10B shows a red pixel with an anode 334-R, emissive layers 332-R, and thin-film transistor circuitry 336-R, a green pixel with an anode 334-G, emissive layers 332-G, and thin-film transistor circuitry 336-G, and a blue pixel with an anode 334-B, emissive layers 332-B, and thin-film transistor circuitry 336-B.

The display includes a pixel definition layer 344 that defines a light-emitting area for each pixel. The pixel definition layer 344 has apertures through which the pixels emit light. In FIG. 10A, the red pixel has an emissive area with a width 340-R (as defined by pixel definition layer 344). The red pixel also has an anode 334-R with the same width 340-R. The green pixel has an emissive area with a width 340-G (as defined by pixel definition layer 344). The green pixel also has an anode 334-G with the same width 340-G. The blue pixel has an emissive area with a width 340-B (as defined by pixel definition layer 344). The blue pixel also has an anode 334-B with the same width 340-B.

In FIG. 10A, the total area of anode 334-R may be approximately the same (e.g., within 1% of, within 5% of, within 10% of, within 20% of, etc.) as the total area of the emissive area for that pixel. The width of anode 334-R may be approximately the same (e.g., within 1% of, within 5% of, within 10% of, within 20% of, etc.) as the width of the emissive area for that pixel. The length of anode 334-R may be approximately the same (e.g., within 1% of, within 5% of, within 10% of, within 20% of, etc.) as the length of the emissive area for that pixel. These relationships also apply to the green and blue pixels in display portion 14-1.

In display portion 14-2 that overlaps the infrared light emitter, the anodes may have an increased size relative to the anodes in display portion 14-1, relative to the emissive areas in display portion 14-1, and relative to the emissive areas in display portion 14-2. In contrast, the emissive areas in display portion 14-2 may have total areas that are approximately the same (e.g., within 1% of, within 5% of, within 10% of, within 20% of, etc.) as the total areas of the emissive areas of the same color in display portion 14-1.

As shown in FIG. 10B, the red pixel in display portion 14-2 has an anode 334-R with a width 342-R. Width 342-R may be greater than the width 340-R of the emissive area for that pixel (e.g., by at least 1%, by at least 5%, by at least 10%, by at least 20%, by at least 50%, etc.). The length of anode 334-R may be greater than the length of the emissive area for that pixel (e.g., by at least 1%, by at least 5%, by at least 10%, by at least 20%, by at least 50%, etc.). The total area of anode 334-R may be greater than the total area of the emissive area for that pixel (e.g., by at least 1%, by at least 5%, by at least 10%, by at least 20%, by at least 50%, etc.). These relationships also apply to the green and blue pixels in display portion 14-2.

Anode width 342-R in FIG. 10B may be greater than anode width 340-R in FIG. 10A (e.g., by at least 1%, by at least 5%, by at least 10%, by at least 20%, by at least 50%, etc.). The length of the anode 334-R in FIG. 10B may be greater than length of anode 334-R in FIG. 10A (e.g., by at least 1%, by at least 5%, by at least 10%, by at least 20%, by at least 50%, etc.). The total area of the anode 334-R in FIG. 10B may be greater than the total area of anode 334-R in FIG. 10A (e.g., by at least 1%, by at least 5%, by at least 10%, by at least 20%, by at least 50%, etc.). These relationships also apply to the green and blue pixels in display portions 14-1 and 14-2.

Increasing the size of the anodes in display portion 14-2 relative to display portion 14-1 may increase the capacitance of the pixels in display portion 14-2, mitigating visible artifacts caused by exposure to infrared light.

In the display of FIGS. 10A and 10B, a shielding layer may be interposed between the pixels and the light-emitter in display portion 14-2. The shielding layer may optionally extend across display portion 14-1. The shielding layer in display portion 14-2 may overlap all of the transistors in the pixels of display portion 14-2 or may have an opening to overlap transistor Tar as discussed in connection with FIGS. 9A and 9B.

The circuit diagrams of FIGS. 4, 5, and 7 are merely illustrative. In general, one or more transistors may be omitted and/or added from these circuit diagrams as desired.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a display comprising pixels; and
   a light emitter that emits light through a portion of the display, wherein the portion of the display comprises a first pixel of the pixels and wherein the first pixel comprises:
      a first power supply terminal;
      a second power supply terminal;
      a light-emitting diode having an anode and a cathode;
      a drive transistor, wherein the drive transistor and the light-emitting diode are connected in series between the first and second power supply terminals;
      a first transistor that is connected between the anode and a first signal line that provides a first bias voltage; and
      a second transistor that is connected between the anode and a second signal line that provides a second bias voltage.

2. The electronic device defined in claim 1, wherein the first transistor comprises a gate terminal that receives a first control signal and wherein the second transistor comprises a gate terminal that receives a second control signal that is different than the first control signal.

3. The electronic device defined in claim 2, wherein the first pixel further comprises:
   a first emission transistor that is interposed between the first power supply terminal and the drive transistor; and
   a second emission transistor that is interposed between the light-emitting diode and the drive transistor.

4. The electronic device defined in claim 3, wherein the first transistor has a first terminal that is connected between the second emission transistor and the light-emitting diode and a second terminal that is connected to the first signal line.

5. The electronic device defined in claim 4, wherein the second transistor has a first terminal that is connected between the second emission transistor and the light-emitting diode and a second terminal that is connected to the second signal line.

6. The electronic device defined in claim 5, wherein the first pixel further comprises:
   a third transistor that has a first terminal connected between the first emission transistor and the drive transistor, a second terminal connected to a data line, and a gate terminal that receives a third control signal.

7. The electronic device defined in claim 6, wherein the first pixel further comprises:
   a fourth transistor that has a first terminal connected between the first emission transistor and the drive transistor, a second terminal connected to a third signal line, and a gate terminal that receives the first control signal.

8. The electronic device defined in claim 1, wherein each pixel in the portion of the display comprises a respective second transistor that is connected between an anode of that pixel and the second signal line that provides the second bias voltage.

9. The electronic device defined in claim 1, further comprising:
   a display driver integrated circuit that is configured to output the second bias voltage on the second signal line.

10. The electronic device defined in claim 1, wherein the light emitter is an infrared light emitter.

11. The electronic device defined in claim 1, wherein the second transistor is configured to be asserted when the light emitter emits light through the portion of the display to prevent leakage current from passing through the light-emitting diode.

12. An electronic device, comprising:
   a display comprising pixels;
   a light emitter that emits light through a portion of the display, wherein the portion of the display comprises a first pixel of the pixels and wherein the first pixel comprises:
      a first power supply terminal;
      a second power supply terminal;
      a light-emitting diode having an anode and a cathode;
      a drive transistor, wherein the drive transistor and the light-emitting diode are connected in series between the first and second power supply terminals; and
      a first transistor that is connected between the anode and a first signal line that provides a first bias voltage; and a shielding layer that blocks the light from the light emitter, wherein the shielding layer is interposed between the light emitter and the first pixel, wherein the shielding layer overlaps the drive transistor, and wherein the shielding layer has an opening that is aligned with the first transistor.

13. The electronic device defined in claim 12, wherein the first pixel further comprises:
    a first emission transistor that is interposed between the first power supply terminal and the drive transistor; and
    a second emission transistor that is interposed between the light-emitting diode and the drive transistor, wherein the shielding layer overlaps the first and second emission transistors.

14. The electronic device defined in claim 13, wherein the first pixel further comprises:
    a second transistor that has a first terminal connected between the first emission transistor and the drive transistor, a second terminal connected to a data line, and a gate terminal, wherein the shielding layer overlaps the second transistor.

15. The electronic device defined in claim 14, wherein the first pixel further comprises:
    a third transistor that has a first terminal connected between the first emission transistor and the drive transistor, a second terminal connected to a second signal line, and a gate terminal, wherein the shielding layer overlaps the third transistor.

16. The electronic device defined in claim 12, wherein the light emitter is an infrared light emitter.

17. The electronic device defined in claim 12, wherein exposure of the first transistor to light from the light emitter through the opening in the shielding layer causes the first transistor to be asserted.

18. An electronic device, comprising:
    a display comprising first and second portions; and
    a light emitter that overlaps the first portion of the display, wherein the light emitter does not overlap the second portion of the display, wherein the first portion of the display comprises a first pixel that emits light of a first color, wherein the first pixel comprises a first anode with a first total area and a first emissive area with a second total area, wherein the second portion of the display comprises a second pixel that emits light of the first color, wherein the second pixel comprises a second anode with a third total area and a second emissive area with a fourth total area, wherein the second total area is within 10% of the fourth total area, and wherein the first total area is at least 20% greater than the third total area.

19. The electronic device defined in claim 18, wherein the third total area is within 10% of the fourth total area and wherein the first total area is at least 20% greater than the second total area.

20. The electronic device defined in claim 18, further comprising:
    a shielding layer that is interposed between the light emitter and the first pixel.

* * * * *